US009824980B2

(12) United States Patent
Saklang et al.

(10) Patent No.: US 9,824,980 B2
(45) Date of Patent: Nov. 21, 2017

(54) LEAD FINGER LOCKING STRUCTURE

(71) Applicant: NXP B.V., Eindhoven (NL)

(72) Inventors: Chayathorn Saklang, Bangkok (TH);
Wiwat Tanwongwan, Bangkok (TH)

(73) Assignee: NXP B.V., Eindhoven (NL)

( * ) Notice: Subject to any disclaimer, the term of this patent is extended or adjusted under 35 U.S.C. 154(b) by 151 days.

(21) Appl. No.: 14/317,224

(22) Filed: Jun. 27, 2014

(65) Prior Publication Data
US 2015/0380362 A1    Dec. 31, 2015

(51) Int. Cl.
*H01L 23/00*   (2006.01)
*H01L 23/495*  (2006.01)
*H01L 23/498*  (2006.01)

(52) U.S. Cl.
CPC ...... *H01L 23/562* (2013.01); *H01L 23/49548* (2013.01); *H01L 23/49861* (2013.01); *H01L 24/46* (2013.01); *H01L 23/49503* (2013.01); *H01L 2924/00014* (2013.01); *H01L 2924/3512* (2013.01)

(58) Field of Classification Search
CPC ..... H01L 23/49558; H01L 2224/48247; H01L 2224/48471; H01L 24/48; H01L 2924/01078; H01L 2224/48463; H01L 2924/01013; H01L 2224/48091; H01L 2924/01029; H01L 2924/0102; H01L 2924/01012; H01L 23/49548; H01L 23/49544; H01L 23/4821; H01L 23/4824; H01L 23/4855; H01L 23/495; H01L 23/49503; H01L 23/49506; H01L 23/4952; H01L 23/49524
See application file for complete search history.

(56) References Cited

U.S. PATENT DOCUMENTS

| | | | |
|---|---|---|---|
| 6,983,537 B2 | 1/2006 | Park | |
| 2002/0027297 A1* | 3/2002 | Ikenaga et al. | 257/784 |
| 2004/0124505 A1* | 7/2004 | Mahle et al. | 257/666 |
| 2008/0122049 A1 | 5/2008 | Zhao et al. | |
| 2010/0203683 A1* | 8/2010 | Lee et al. | 438/123 |
| 2013/0264693 A1* | 10/2013 | Wong et al. | 257/676 |

(Continued)

OTHER PUBLICATIONS

Ishiko et al., "Design concept for wire-bonding reliability improvement by optimizing position in power devices" Microelectronics Hournal 37, pp. 262-268, 2006.

(Continued)

*Primary Examiner* — Michael Carter
*Assistant Examiner* — Mohammed R Alam

(57) ABSTRACT

Various aspects are directed to apparatuses, systems and related methods involving the mitigation of issues relating to thermal expansion and contraction of lead fingers of an integrated circuit package. Consistent with one or more embodiments, lead fingers on a leadframe substrate each have a locking structure that secures the lead finger in place relative to the substrate. The lead fingers provide a location to attach a bond wire to an integrated circuit, and connect the bond wire to terminals at a perimeter of the leadframe. The locking structure and arrangement of the lead fingers mitigate issues such as cracking or breaking of a solder connection of the bond wire to the leadframe, which can occur due to thermal expansion and contraction.

20 Claims, 10 Drawing Sheets

(56) References Cited

U.S. PATENT DOCUMENTS

2016/0254215 A1* 9/2016 Sato ................. H01L 24/85
257/668

OTHER PUBLICATIONS

Kock et al., "Improved thermal management of low voltage power deivces with optimized bond wire positions" Microelectronics Reliability 51, pp. 1913-1918, 2011.
England et al., "Solder Joint Reliability analysis and testing of a dual row QFN Package" SMTA International Conference Proceedings.

* cited by examiner

LEAD FINGER LOCKING STRUCTURE

Various aspects of the present disclosure are directed to integrated circuit packaging and implementation thereof, and more particularly to integrated circuit packaging utilizing leadframes that electrically connect the integrated circuit to a substrate and/or another integrated circuit. Various embodiments address issues relating to thermal and other stress that may cause structural issues, such as with connections between bond wires and leadframes. For instance, various integrated circuit packages employ a leadframe having lead fingers that connect terminals near a perimeter of the leadframe to an inner portion of the leadframe where an integrated circuit die can be connected via bond wires. During use, the lead fingers of the integrated circuit package may experience thermal expansion and contraction, which can cause stress on connected components (e.g., solder connections between lead fingers and bond wires). Such thermal stress, over-time, may cause premature failure of the integrated circuit. These issues can present challenges. As such, aspects of the present disclosure are directed to locking structure(s) that mitigate or eliminate lead finger thermal expansion and contraction issues, thereby mitigating solder connection failures between a lead finger and a bond wire.

In accordance with one or more embodiments, an apparatus includes a leadframe substrate and a plurality of lead fingers on the substrate. Each lead finger has a locking structure that attaches to a bond wire and that operates with the leadframe substrate and the lead finger to secure or lock the lead finger in place relative to the substrate.

Various embodiments are directed to an apparatus including a substrate that has a rectangular shape defined by a perimeter and a central region within that perimeter. The rectangular substrate has a width greater than its length, with a plurality of terminals bonded to the perimeter of the substrate along the width. The apparatus further includes an integrated circuit die bonded to the central region of the substrate. Lead fingers of about equal length extend from the terminals toward the central region of the substrate, in a direction perpendicular to the width. A bond wire couples an end of each lead finger to a terminal on the integrated circuit die, and operates with the lead finger to pass signals between the terminals to which the lead finger and bond wires are connected.

Some embodiments are directed to a flip-chip package having a processor chip attached to a leadframe. The leadframe includes a substrate and a plurality of lead fingers on the substrate, each lead finger having a locking structure that secures the lead finger in place relative to the substrate. The locking structures mitigate thermal expansion and contraction of the lead finger, which can mitigate or eliminate issues related to thermal stress, such as solder connection failures between the lead finger and a bond wire.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
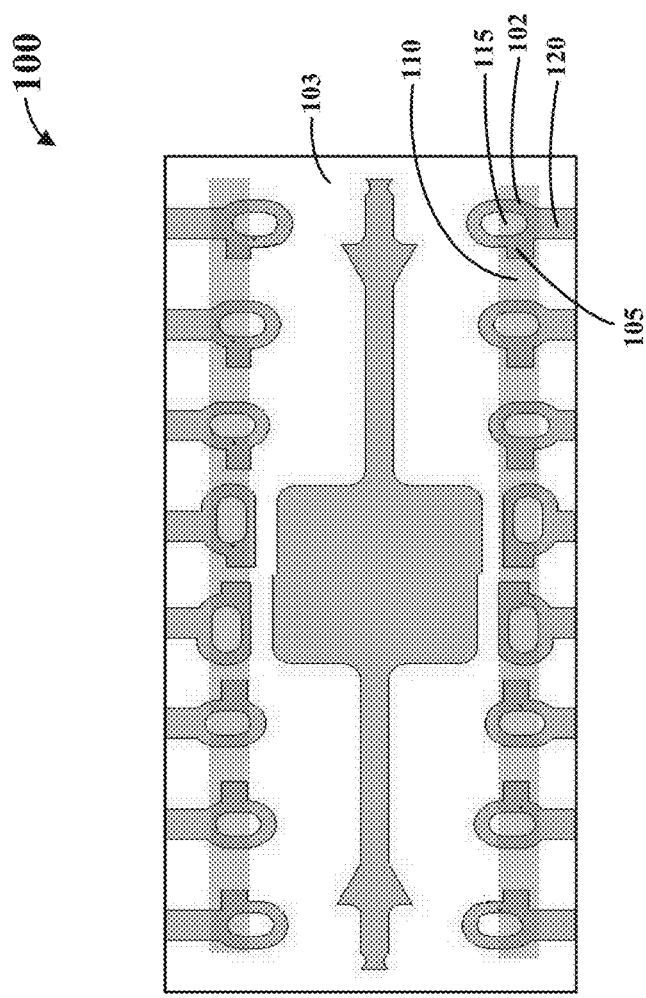
FIG. 1 shows a top view of a leadframe circuit including lead fingers with locking structures, consistent with various aspects of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present invention are believed to be applicable to a variety of different types of apparatuses and systems involving integrated circuit packaging. While the present invention is not necessarily so limited, various aspects of the invention may be appreciated through a discussion of examples using this context.

Various aspects of the present disclosure are directed to integrated circuit packaging and implementation thereof, and more particularly to integrated circuit packaging utilizing leadframes to electrically connect the integrated circuit to a substrate and/or another integrated circuit. In one embodiment of the present disclosure, lead fingers are placed on a leadframe substrate, each lead finger having a locking structure that secures the lead finger in place relative to the substrate. The lead fingers provide a location for attaching a bond wire from the integrated circuit. During use, the lead fingers experience thermal expansion and contraction, as may be caused by the flow of electrons through the lead fingers. This thermal expansion and contraction of the lead fingers causes undue stress on solder or other connections between the lead finger and bond wires electrically connecting the integrated circuit to the leadframe. Such thermal stress, over-time, may cause premature failure of the solder connection and prevent proper operation of the integrated circuit. The locking structure of each lead finger mitigates such lead finger thermal expansion and contraction (in some embodiments as much as 30%), thereby mitigating solder connection failures between the lead finger and a bond wire.

In various embodiments, a locking structure of a lead finger (e.g., as described above) includes a portion that defines an opening that secures/locks the lead finger to the substrate via the opening. In some implementations, the portion of the lead finger including the locking structure defines an inner portion, and an outer portion of the lead finger connects the inner portion to a terminal at a perimeter of the leadframe substrate. The inner and outer portions of the leadframe pass signals between the terminal and an integrated circuit die via a bond wire. In further implementations, the plurality of lead fingers extends in a direction perpendicular to an elongated portion of a perimeter of the leadframe substrate, each lead finger having a length between the terminal and the locking structure that is about constant. In such an implementation, the apparatus may further include the integrated circuit die and a plurality of bond wires, each bond wire connecting the integrated circuit die to one of the lead fingers. The various bond wires having various lengths defined by the respective distance between the integrated circuit and the lead finger connected by the bond wire.

In certain embodiments, the locking structure includes a portion that defines an opening or a cavity. In some implementations, the opening/cavity is filled with an adhesive or other material to secure or lock the lead finger to the substrate. In other implementations, a portion of the substrate extends into the locking structure opening, thereby securing the lead finger to the substrate. The secured lead finger is less prone to thermal expansion and contraction which mitigates connection failures between the lead finger and a bond wire (e.g., via reduction in thermal stresses along a line substantially parallel to bond wire).

In some embodiments, a leadframe substrate has a rectangular shape having a width and a length. Terminals are located along a length of the perimeter of the leadframe substrate. Lead fingers extend perpendicularly to the sides of the leadframe substrate along the length, and inner portions of the lead fingers are bound within a first rectangular surface region on the surface of the leadframe substrate. The first rectangular surface region has a length that is defined by the length of the leadframe substrate, a width defined by a length of a longest one of the locking structures, and an area that is between 0.1-0.3 times the surface area of the leadframe substrate. Outer portions of the lead fingers are bound within a second rectangular surface region on the surface of the leadframe substrate. The second rectangular surface region has a length that is defined by the length of the leadframe substrate, a width defined by a length of an outer portion of one of the locking structures, and an area that is between 0.1-0.25 times the surface area of the leadframe substrate.

In more specific embodiments of the present disclosure, the locking structure includes a portion that defines an opening extending through the locking structure from an upper surface to a lower surface, in contact with a substrate. An adhesive is injected into the opening and secures the lead finger to the substrate via the opening.

Various embodiments are directed to an apparatus including a substrate having a rectangular shape defined by a perimeter and a central region within that perimeter (e.g., where a die may be located). The rectangular substrate has a width greater than its length, with a plurality of terminals bonded to the perimeter of the substrate along the width. The apparatus further includes an integrated circuit die bonded to the central region of the substrate. Lead fingers extend from a first end at each terminal, to a second end in a direction toward the central region of the substrate and perpendicular to the width. In some embodiments, the lead fingers are of about equal length, and the bond wires are of varied length to accommodate extension to ones of the lead fingers that are further away from the die. At a second end of each lead finger, a bond wire connects the lead finger to a terminal on the integrated circuit die. Accordingly, the bond wire and the lead finger pass signals between the terminal to which the lead finger is connected and the integrated circuit die.

Some embodiments are further directed to a flip-chip package including a processor chip and a leadframe to which the processor chip is attached. The leadframe includes a leadframe substrate and a plurality of lead fingers on the substrate, each lead finger having a locking structure that secures the lead finger in place relative to the substrate. The locking structures of each lead finger mitigate thermal expansion and contraction of the lead finger, thereby mitigating related issues such as solder connection failures between the lead finger and a bond wire.

Embodiments of the present disclosure can be used in a variety of applications as they are compatible with a variety of leadframe raw materials (including leadframe substrates with/without plating), adhesive material types, wire bonding materials/techniques, encapsulation materials and molding techniques. Various embodiments are directed to implementation with flat leadframes, in which a die is located on a common surface with a bonding pad, and other embodiments are directed to implementation with leadframes having varied surfaces with raised or recessed regions (e.g., with a die pad recessed relative to bond pads). Further, the various stress reduction benefits, as achieved in connection with embodiments herein, are applicable to various leadframe designs.

Turning now to the figures, FIG. 1 shows a top view of a leadframe circuit 100 including lead fingers with locking structures, consistent with various aspects of the present disclosure. By way of example, lead finger 102 is labeled and includes an inner portion 110 and an outer portion 120. The inner portion 110 includes a locking structure 115 and a bond pad 105. The locking structure 115 secures the lead finger 102 to a leadframe substrate 103. The various other lead fingers may be implemented in a manner similar to that discussed with lead finger 102.

In the present embodiment, the locking structure 115 is a cavity that extends through the lead finger 102. To secure the lead finger 102 to the leadframe substrate 103, adhesive may be applied to the locking structure 115, or the leadframe substrate 103 may extend into the locking structure 115. The locking structure 115, as secured to the leadframe substrate 103, mitigates the thermal expansion and contraction of the lead finger 102, which may occur during operation of an integrated circuit die attached to the leadframe circuit 100. The outer portion 120 of the lead finger 102 may be electrically connected to a terminal (or form such a terminal) at a perimeter of the leadframe substrate 103.

Figure 2:
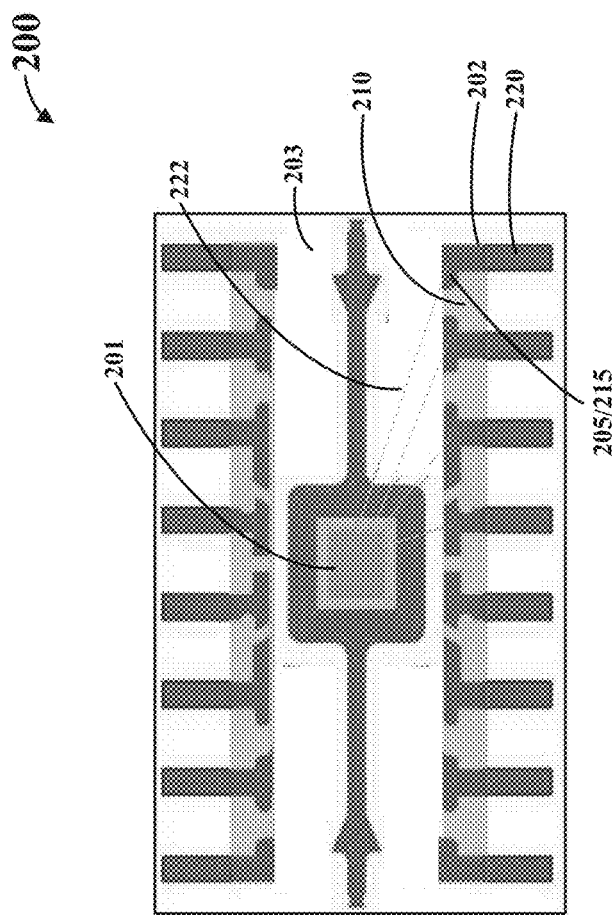
FIG. 2 shows a top view of another leadframe circuit including lead fingers with locking structures, consistent with various aspects of the present disclosure.

FIG. 2 shows a top view of a leadframe circuit 200 including lead fingers with locking structures 205, consistent with various aspects of the present disclosure. In the present embodiment, the locking structures 205 interface with portions of a leadframe substrate 203 to mitigate vertical expansion and contraction of the lead fingers (with lead finger 202 labeled by way of example). A bond pad 215 located at an inner portion 210 where lead finger 202 is communicatively coupled to an integrated circuit die 201 via a bond wire 222. The bond wire 222 and lead finger 202 are coupled together with a solder joint at bond pad 215.

During operation of the resulting integrated circuit package, the flow of electrons to and from the integrated circuit die 201 via the lead finger 202 and/or other heat sources may cause thermal expansion and contraction of the lead fingers 202, as discussed above. The locking structures 205 mitigate this expansion and contraction, which may otherwise degrade the electrical connection over time and possibly result in the total failure (e.g., of a solder joint that joins the lead finger 202 to the bond wire 222). As may be consistent with the discussion in reference to FIG. 1 above, an outer portion 220 of the lead finger 202 electrically connects the inner portion 210 of the lead finger 202 to a terminal at a perimeter of the leadframe substrate 203. Such a terminal may, for example, electrically connect the integrated circuit die 201 to other integrated circuitry.

Figure 3:
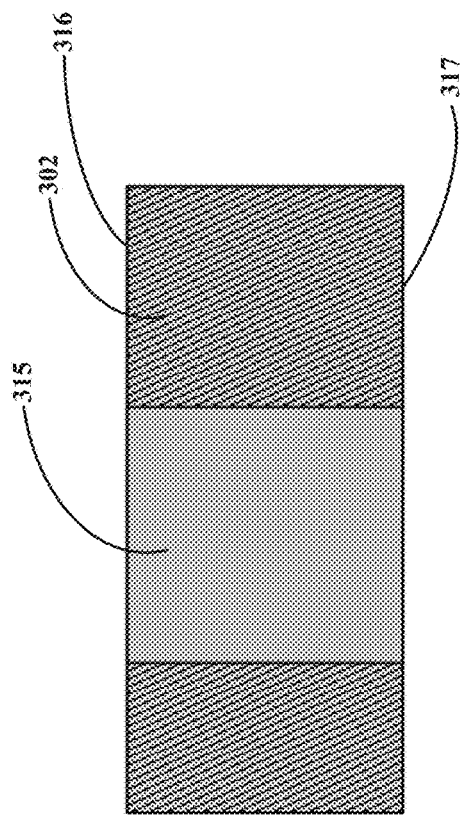
FIG. 3 shows a cross-sectional view of a lead finger with a locking structure, consistent with various aspects of the present disclosure.

FIG. 3 shows a cross-sectional view of a lead finger 302 with locking structure 315, consistent with various aspects of the present disclosure. As shown in the embodiment of FIG. 3, the locking structure 315 extends through the lead finger 302 from an upper surface 316 to a lower surface 317. As discussed above, in various embodiments, adhesive or a portion of the leadframe substrate (not shown) may extend into a portion of the locking structure 315 to secure the lead finger 302 to the leadframe substrate.

Figure 4:
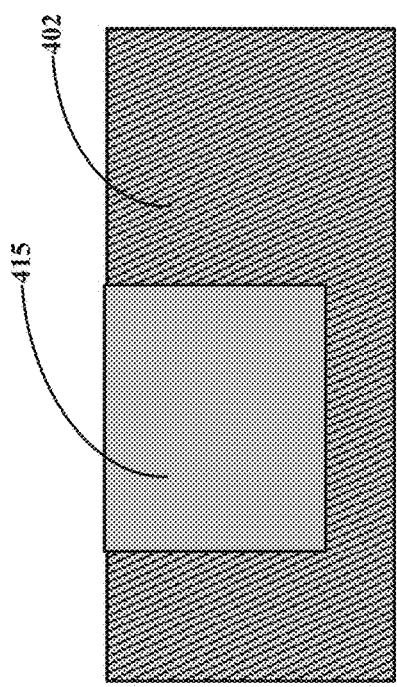
FIG. 4 shows a cross-sectional view of a lead finger with a locking structure, consistent with various aspects of the present disclosure.
Figure 5:
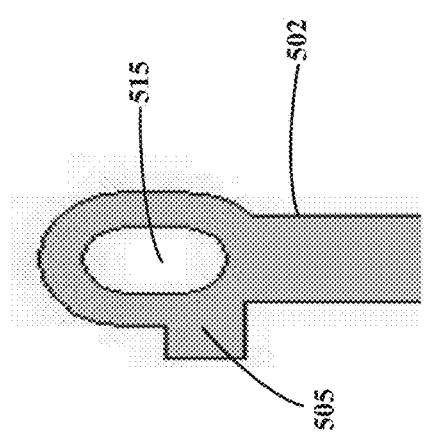
FIG. 5 shows a top view of a lead finger with a locking structure, consistent with various aspects of the present disclosure.
Figure 6:
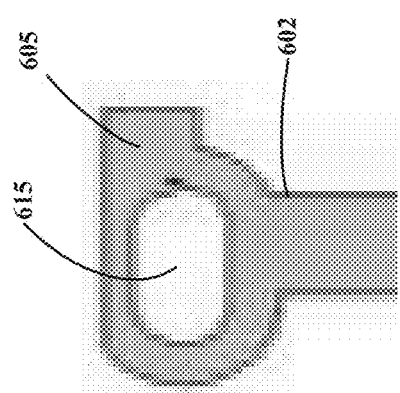
FIG. 6 shows a top view of a lead finger with a locking structure, consistent with various aspects of the present disclosure.
Figure 7:
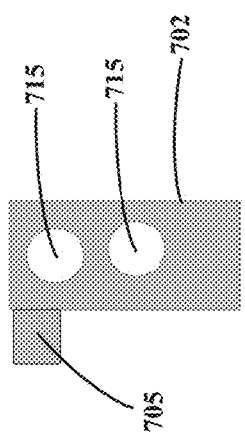
FIG. 7 shows a top view of a lead finger with locking structures, consistent with various aspects of the present disclosure.
Figure 8:
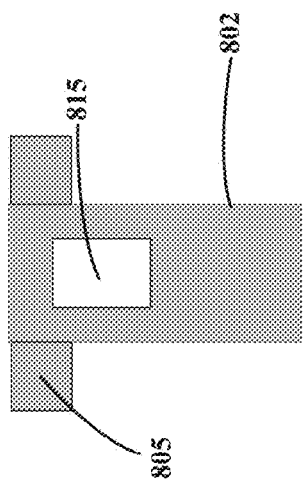
FIG. 8 shows a top view of a lead finger with locking structure, consistent with various aspects of the present disclosure.
Figure 9:
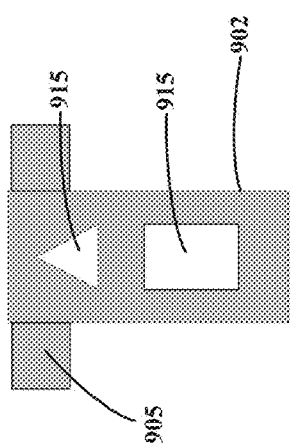
FIG. 9 shows a top view of a lead finger with locking structures, consistent with various aspects of the present disclosure.
Figure 10:
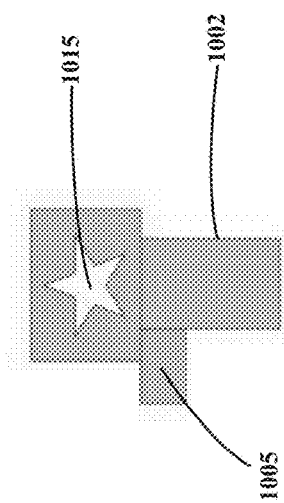
FIG. 10 shows a top view of a lead finger with a locking structure, consistent with various aspects of the present disclosure.

FIG. 4 shows a cross-sectional view of a lead finger 402, with locking structure 415 forming a cavity. Such a cavity allows for an adhesive application which fills the locking structure 415 and covers or partially covers a mechanical connection to a bond wire (e.g., such as shown in FIGS. 1-2). Accordingly, stress on mechanical joints caused by thermal expansion and contraction of the lead finger 402 can be reduced or eliminated.

FIGS. 5-10 show a number of embodiments of a lead finger, consistent with various aspects of the present disclosure. As shown in the various embodiments, each locking feature 515, 615, 715, 815, 915, and 1015 shows an exemplary variation of locking feature shapes that may be used to secure a lead finger (for example, 502 of FIG. 5) to a leadframe substrate. Accordingly, in FIGS. 5-10, the bonding pad 505, 605, 705, 805, 905, and 1005, respectively, by virtue of its shape also contributes to the ability of the lead finger 502, 602, 702, 802, 902, and 1002 to act as a locking feature and secure itself to the leadframe substrate.

Based upon the above discussion and illustrations, those skilled in the art will readily recognize that various modifications and changes may be made to the present invention without strictly following the exemplary embodiments and applications illustrated and described herein. For example, the locking feature of the lead finger may take on a number of forms and shapes including cavities, openings, and extruded features. Such modifications do not depart from the true spirit and scope of the present invention, including that set forth in the following claims.

What is claimed is:

1. An apparatus comprising:
a leadframe substrate; and
a plurality of lead fingers on the leadframe substrate, each of the lead fingers having a locking structure configured and arranged to attach to a bond wire, the locking structure configured and arranged with the leadframe substrate and the lead finger to secure or lock the lead finger in place relative to the leadframe substrate and to mitigate thermal expansion and contraction of the lead finger via securing or locking, wherein
the leadframe substrate has a rectangular shape with a width and a length, and the plurality of lead fingers are configured to extend perpendicularly to and along sides of the leadframe substrate along the length, wherein inner portions of the lead fingers are secured within a first rectangular surface region on a surface of the leadframe substrate, and wherein the first rectangular surface region defines an area that is between 0.1-0.3 times an overall surface area of the leadframe substrate.

2. The apparatus of claim 1, wherein
for each lead finger, the locking structure includes a surface of the lead finger which defines an opening therein and is engaged with the leadframe substrate via the opening, therein securing or locking the lead finger in place relative to the leadframe substrate.

3. The apparatus of claim 2, wherein the locking structure is configured and arranged to secure or lock the lead finger to the leadframe substrate via the opening.

4. The apparatus of claim 1, wherein each lead finger includes:
an inner portion including the locking structure, the locking structure defining an opening and being configured and arranged to secure or lock the lead finger to the leadframe substrate via the opening, the inner portion being configured and arranged to bond to an integrated circuit die via a bond wire, and
an outer portion that connects the inner portion to a terminal at a perimeter of the leadframe substrate and that is configured and arranged with the inner portion to pass signals between the terminal and the integrated circuit die, via the bond wire.

5. The apparatus of claim 4, wherein a plurality of the lead fingers extend in a direction perpendicular to an elongated portion of a perimeter of the leadframe substrate, and have a length between the terminal and the locking structure that is about constant.

6. The apparatus of claim 5, further including the integrated circuit die and a plurality of bond wires, each bond wire connecting the integrated circuit die to one of the fingers, various ones of the bond wires having different lengths, relative to other ones of the bond wires and a distance between the integrated circuit die and the locking structure to which the bond wire is connected.

7. The apparatus of claim 4, wherein
the terminals at the perimeter are located along sides of the leadframe substrate along the length;
the inner portions of the lead fingers are bound within the first rectangular surface region on the surface of the leadframe substrate, the first rectangular surface region having a length that is defined by the length of the leadframe substrate, and a width defined by a length of a longest one of the locking structures; and
the outer portions of the lead fingers are bound within a second rectangular surface region on the surface of the leadframe substrate, the second rectangular surface region having a length that is defined by the length of the leadframe substrate, a width defined by a length of an outer portion of one of the locking structures, and an area that is between 0.1-0.25 times the overall surface area of the leadframe substrate.

8. The apparatus of claim 1, wherein the locking structure includes a portion that defines an opening, further including an adhesive in the opening, the locking structure being configured and arranged with the adhesive to secure or lock the lead finger to the leadframe substrate via the opening.

9. The apparatus of claim 1, wherein the locking structure includes a portion that defines an opening, and the leadframe substrate includes a portion that extends into the opening.

10. The apparatus of claim 1, wherein the locking structure includes a portion that defines a cavity, and further includes an adhesive in the cavity, the locking structure being configured and arranged with the adhesive to secure or lock the lead finger to the leadframe substrate via the cavity.

11. The apparatus of claim 1, wherein the locking structure includes a portion that defines an opening extending through the locking structure from an upper surface to a lower surface in contact with the leadframe substrate, and further includes an adhesive in the opening, the locking structure being configured and arranged with the adhesive to secure or lock the lead finger to the leadframe substrate via the opening.

12. An apparatus comprising:
a substrate having a rectangular shape, a perimeter and a central region within the perimeter, the rectangular shape having a length and width, the length being greater than the width;
an integrated circuit die in the central region and bonded to the substrate;
a plurality of terminals at the perimeter along the length;
a plurality of lead fingers of about equal length on the substrate, each lead finger having a first end connected to one of the terminals and a second end extending from the one of the terminals toward the central region in a direction that is perpendicular to the length;
for each lead finger, a bond wire connected to the second end of the lead finger and to a terminal on the integrated circuit die, the bond wire being configured and arranged with the lead finger to which it is connected to pass signals between the terminal to which the lead finger is connected and the integrated circuit die; and
a locking structure for each lead finger, the locking structure including and configured and arranged with the substrate to mitigate breakage of the bonding wire connected to the lead finger, wherein
second ends of the lead fingers are secured within a rectangular surface region on a surface of the substrate, and wherein the rectangular surface region defines an area that is between 0.1-0.3 times an overall surface area of the substrate.

13. An apparatus comprising:
a substrate having a rectangular shape, a perimeter and a central region within the perimeter, the rectangular shape having a length and width, the length being greater than the width;
an integrated circuit die in the central region and bonded to the substrate;
a plurality of terminals at the perimeter along the length;
a plurality of lead fingers of about equal length on the substrate, each lead finger having a first end connected to one of the terminals and a second end extending from the one of the terminals toward the central region in a direction that is perpendicular to the length; and
for each lead finger, a bond wire connected to the second end of the lead finger and to a terminal on the integrated circuit die, the bond wire being configured and arranged with the lead finger to which it is connected to pass signals between the terminal to which the lead finger is connected and the integrated circuit die,
wherein the second end of each lead finger includes a surface area forming a cavity having an opening, wherein the surface area is configured and arranged with the substrate to secure or lock the lead finger in place relative to the substrate, at least a portion of the surface area being engaged with the substrate via the opening, therein securing or locking the lead finger in place relative to the substrate, and
wherein the substrate includes a portion that extends into the opening.

14. The apparatus of claim 12, wherein each lead finger is configured and arranged with the substrate to mitigate breakage of the bonding wire connected to the lead finger, by preventing thermal expansion movement of the lead finger relative to the substrate, wherein the surface area forming the cavity is configured with an adhesive and the substrate to secure or lock the lead finger to the substrate.

15. The apparatus of claim 12, wherein the second end of each lead finger defines an opening extending into the lead finger and configured and arranged to secure or lock the lead finger in place relative to the substrate.

16. The apparatus of claim 15, wherein the opening extends through the lead finger from an upper surface to a lower surface that is on the substrate, further including at least one of an adhesive and a portion of the substrate in the opening and configured and arranged to secure or lock the lead finger in place relative to the substrate.

17. A flip-chip package comprising:
an integrated circuit chip;
a leadframe, the integrated circuit chip being attached to the leadframe, the leadframe including
a leadframe substrate, and
a plurality of lead fingers on the leadframe substrate, each of the lead fingers having a locking structure, the locking structure configured and arranged with the leadframe substrate and the lead finger to secure or lock the lead finger in place relative to the leadframe substrate; and
a plurality of bond wires, each bond wire being connected to one of the lead fingers and to a contact on the integrated circuit chip, wherein for each of the lead fingers the locking structure is configured and arranged to include a portion of the lead finger wherein the locking structure and the leadframe substrate are configured and arranged to mitigate thermal expansion and contraction of the lead finger via securing or locking, wherein
locking structures of the lead fingers are secured within a rectangular surface region on a surface of the leadframe substrate, and wherein the rectangular surface region defines an area that is between 0.1-0.3 times an overall surface area of the leadframe substrate.

18. The flip chip package of claim 17, wherein the locking structure of each lead finger is configured and arranged to mitigate thermal stresses along a line substantially parallel to the bond wire connected to the lead finger, by securing or locking the lead finger in place relative to the leadframe substrate.

19. A flip-chip package comprising:
an integrated circuit chip;
a leadframe, the integrated circuit chip being attached to the leadframe, the leadframe including
a leadframe substrate, and
a plurality of lead fingers on the leadframe substrate, each of the lead fingers having a locking structure, the locking structure configured and arranged with the leadframe substrate and the lead finger to secure or lock the lead finger in place relative to the leadframe substrate; and
a plurality of bond wires, each bond wire being connected to one of the lead fingers and to a contact on the integrated circuit chip;
a plurality of terminals at a perimeter of the leadframe substrate, wherein each lead finger includes:
an inner portion including the locking structure, the locking structure defining an opening and being configured and arranged to secure or lock the lead finger to the leadframe substrate via the opening, the inner portion being configured and arranged to bond one of the bond wires, and an outer portion that connects the inner portion to one of the terminals and that is configured and arranged with the inner portion to pass signals between the one of the terminals and the integrated circuit chip, via the bond wire, wherein inner portions of the lead fingers are secured within a first rectangular surface region on a surface of the leadframe substrate, and wherein the first rectangular surface region defines an area that is between 0.1-0.3 times an overall surface area of the leadframe substrate.

20. The flip chip package of claim 19, wherein the leadframe substrate has a rectangular shape having a width and a length, the lead fingers extend perpendicularly to the side of the leadframe substrate along the length, the outer portions of the lead fingers are bound within a second rectangular surface region on the surface of the leadframe substrate, a ratio of the second rectangular surface region to an overall surface area of the leadframe is in the range of 0.1 to 0.25, and a ratio of the first rectangular surface region to the overall surface area of the leadframe is in the range of 0.1 to 0.3.

* * * * *